(12) United States Patent
Sawachi et al.

(10) Patent No.: US 12,424,423 B2
(45) Date of Patent: Sep. 23, 2025

(54) SUBSTRATE PROCESSING APPARATUS

(71) Applicant: TOKYO ELECTRON LIMITED, Tokyo (JP)

(72) Inventors: Atsushi Sawachi, Miyagi (JP); Jun Hirose, Miyagi (JP); Takuya Nishijima, Miyagi (JP); Ichiro Sone, Miyagi (JP); Suguru Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 418 days.

(21) Appl. No.: 17/356,997

(22) Filed: Jun. 24, 2021

(65) Prior Publication Data

US 2021/0407768 A1 Dec. 30, 2021

(30) Foreign Application Priority Data

Jun. 24, 2020 (JP) ................................ 2020-109076
Apr. 22, 2021 (JP) ................................ 2021-072755

(51) Int. Cl.
*H01J 37/32* (2006.01)
*C23C 16/458* (2006.01)

(52) U.S. Cl.
CPC ...... *H01J 37/3288* (2013.01); *C23C 16/4585* (2013.01); *H01J 37/32513* (2013.01); *H01J 37/32715* (2013.01)

(58) Field of Classification Search
None
See application file for complete search history.

(56) References Cited

U.S. PATENT DOCUMENTS

| 6,098,637 A * | 8/2000 | Parke ................... B08B 7/0057 |
| | | 118/724 |
| 2003/0168168 A1* | 9/2003 | Liu ....................... C23C 14/564 |
| | | 118/723 R |

(Continued)

FOREIGN PATENT DOCUMENTS

| JP | 2007-165659 A | 6/2007 |
| JP | 2019-125685 A | 7/2019 |

(Continued)

OTHER PUBLICATIONS

English Machine Translation of Sato et al. KR20100107389A retrieved from Espacenet on Jan. 25, 2024 (Year: 2024).*

(Continued)

*Primary Examiner* — Parviz Hassanzadeh
*Assistant Examiner* — Laureen Chan
(74) *Attorney, Agent, or Firm* — XSENSUS LLP

(57) ABSTRACT

A substrate processing apparatus includes a first chamber having an inner space and an opening, a substrate support disposed in the inner space of the first chamber, an actuator configured to move the substrate support between a first position and a second position, a second chamber that is disposed in the inner space of the first chamber and defines a substrate processing space together with the substrate support when the substrate support is located at the first position, and at least one fixing mechanism configured to detachably fix the second chamber to the first chamber in the inner space of the first chamber. The second chamber is transferred between the inner space of the first chamber and an outside of the first chamber through the opening when the substrate support is located at the second position.

18 Claims, 14 Drawing Sheets

(56) References Cited

U.S. PATENT DOCUMENTS

| | | | | |
|---|---|---|---|---|
| 2004/0060661 A1* | 4/2004 | Nishimoto | ........ | H01J 37/32009 156/345.43 |
| 2004/0182833 A1* | 9/2004 | Fink | .................... | C23C 16/4404 219/121.43 |
| 2005/0205209 A1* | 9/2005 | Mosden | ............ | H01L 21/67069 156/345.31 |
| 2008/0087641 A1* | 4/2008 | De La Llera | ..... | H01J 37/32541 438/689 |
| 2012/0003836 A1* | 1/2012 | Kellogg | ............ | H01L 21/68785 118/723 R |
| 2013/0087286 A1* | 4/2013 | Carducci | ........... | H01J 37/32733 156/345.43 |
| 2017/0330736 A1* | 11/2017 | De Bosscher | ........ | H01J 37/347 |
| 2019/0221406 A1* | 7/2019 | Funakubo | ........... | H01L 21/0276 |
| 2019/0348262 A1 | 11/2019 | Hayasaka et al. | | |

FOREIGN PATENT DOCUMENTS

| | | | |
|---|---|---|---|
| JP | 2019-197849 A | | 11/2019 |
| KR | 100854803 B1 | | 8/2008 |
| KR | 20100107389 A | * | 10/2010 |
| KR | 20190087323 A | | 7/2019 |

OTHER PUBLICATIONS

Merriam-Webster dictionary definition of "enclosed" retrieved from https://www.merriam-webster.com/dictionary/enclosed on Jan. 21, 2025 (Year: 2025).*

* cited by examiner

SUBSTRATE PROCESSING APPARATUS

CROSS-REFERENCE TO RELATED APPLICATIONS

This application claims priority to Japanese Patent Application Nos. 2020-109076 and 2021-072755, respectively filed on Jun. 24, 2020 and Apr. 22, 2021, the entire contents of which are incorporated herein by reference.

TECHNICAL FIELD

An exemplary embodiment of the present disclosure relates to a substrate processing apparatus, a substrate processing system, and a maintenance method.

BACKGROUND

A plasma processing apparatus is used for plasma processing performed on a substrate. The plasma processing apparatus includes a chamber and a substrate support. The substrate support supports a substrate in the chamber. The substrate is processed by chemical species from plasma generated from a processing gas in the chamber (see, e.g., Japanese Patent Application Publication No. 2019-197849).

SUMMARY

The present disclosure provides a technique for facilitating maintenance of a chamber that defines a substrate processing space where a substrate is processed.

In accordance with an aspect of the present disclosure, a substrate processing apparatus is provided. The substrate processing apparatus includes a first chamber, a substrate support, an actuator, a second chamber, and at least one fixing mechanism. The first chamber has an inner space and an opening. The substrate support is disposed in the inner space of the first chamber. The actuator is configured to move the substrate support between a first position and a second position. The second chamber is disposed in the inner space of the first chamber. The second chamber defines a substrate processing space together with the substrate support when the substrate support is located at the first position. The second chamber can be transferred between the inner space of the first chamber and an outside of the first chamber through the opening when the substrate support is located at the second position. At least one fixing mechanism is configured to detachably fix the second chamber to the first chamber in the inner space of the first chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
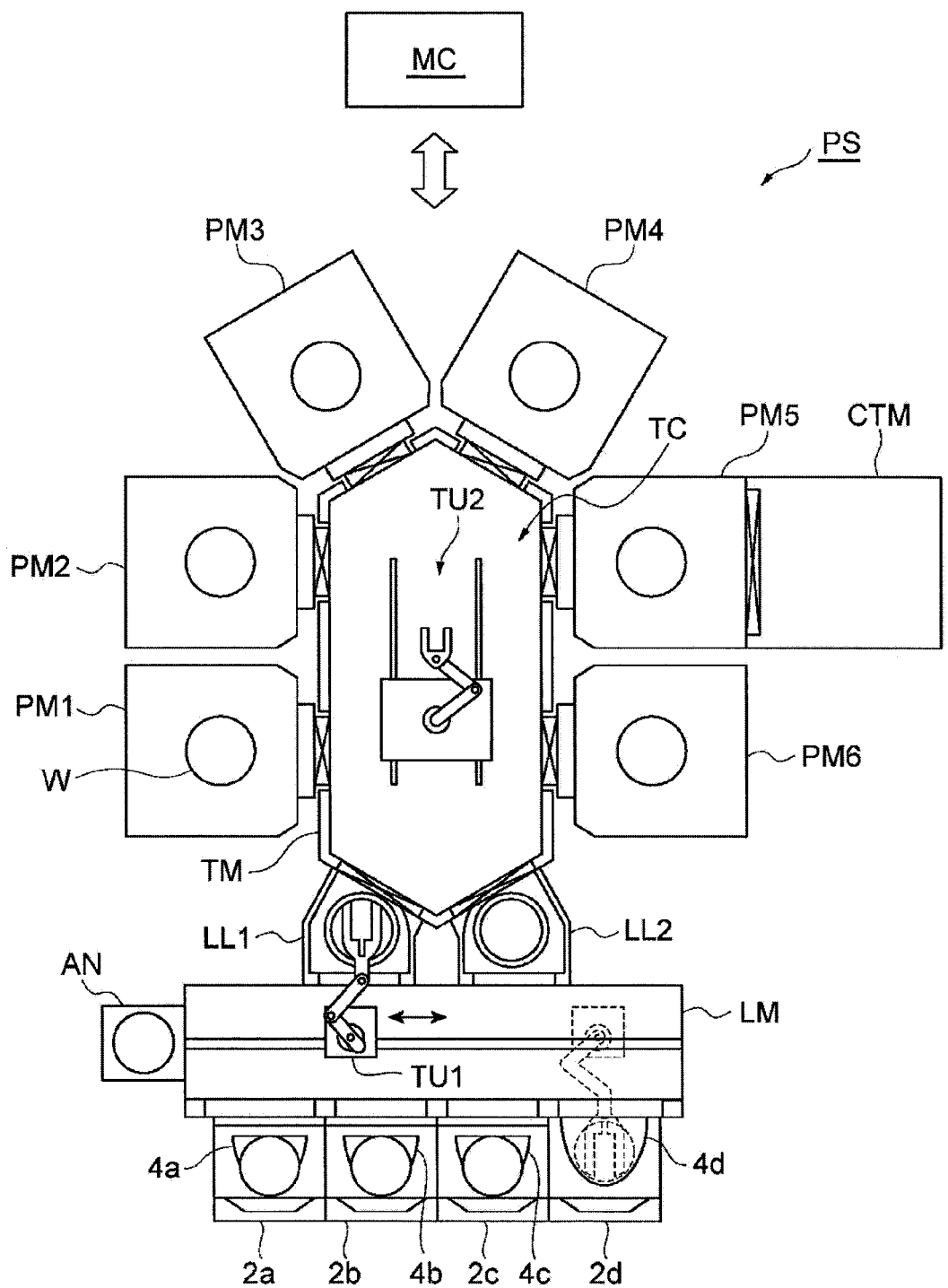
FIG. 1 shows a substrate processing system according to one exemplary embodiment.

Hereinafter, various exemplary embodiments will be described.

In one exemplary embodiment, a substrate processing apparatus is provided. The substrate processing apparatus includes a first chamber, a substrate support, an actuator, a second chamber, and at least one fixing mechanism. The first chamber has an inner space and an opening. The substrate support is disposed in the inner space of the first chamber. The actuator is configured to move the substrate support between a first position and a second position. The second chamber is disposed in the inner space of the first chamber. The second chamber defines a substrate processing space together with the substrate support when the substrate support is located at the first position. The second chamber can be transferred between the inner space of the first chamber and an outside of the first chamber through the opening when the substrate support is located at the second position. At least one fixing mechanism is configured to detachably fix the second chamber to the first chamber in the inner space of the first chamber.

In the substrate processing apparatus of the above-described embodiment, the substrate is processed in the second chamber. The second chamber is disposed in the first chamber and fixed to the first chamber. The fixing of the second chamber to the first chamber can be released. Further, in a state where the fixing of the second chamber to the first chamber is released, the second chamber can be unloaded to the outside of the first chamber through the opening of the first chamber. Therefore, in accordance with the above-described embodiment, it is possible to facilitate maintenance of the chamber, i.e., the second chamber, that defines a substrate processing space where the substrate is processed.

In one exemplary embodiment, the second chamber may include a baffle and one or more ring members. The baffle is disposed to surround the substrate support when the substrate support is located in the first position. One or more ring members are arranged to surround the substrate placed on the substrate support in the substrate processing space when the substrate support is located in the first position.

In one exemplary embodiment, at least one fixing mechanism may be configured to detachably fix a ceiling portion of the second chamber to a ceiling portion of the first chamber in the inner space of the first chamber.

In one exemplary embodiment, at least one fixing mechanism may include an engaging member configured to be engaged with the ceiling portion of the second chamber and a biasing member for biasing the engaging member upward in a state where the engaging member is engaged with the ceiling portion of the second chamber.

In one exemplary embodiment, the substrate processing apparatus may further include a release mechanism configured to release the fixing of the second chamber to the first chamber by at least one fixing mechanism.

In one exemplary embodiment, the release mechanism may include an air supply device.

In one exemplary embodiment, at least one fixing mechanism may include an engaging member and a cam mechanism. The engaging member is configured to be engaged with the ceiling portion of the second chamber. The cam mechanism is configured to move the engaging member engaged with the ceiling portion of the second chamber upward so that the ceiling portion of the second chamber is brought into contact with the ceiling portion of the first chamber.

In one exemplary embodiment, the first chamber may have a substrate transfer port. The second chamber may include a movable shutter that faces the substrate transfer port when the second chamber is fixed to the first chamber in the inner space of the first chamber. The substrate processing apparatus may further include an additional actuator configured to drive the movable shutter between an open position and a closed position.

In another exemplary embodiment, a substrate processing apparatus is provided. The substrate processing apparatus includes a first chamber, a substrate support, a second chamber, at least one actuator, and at least one fixing mechanism. The first chamber has a first inner space and a first opening. The substrate support is disposed in the first inner space. The second chamber is disposed in the first inner space and has a second inner space and a second opening. At least one actuator is configured to relatively move at least one of the substrate support and the second chamber between a first state and a second state in the first inner space. In the first state, the second opening is closed by the substrate support. In the second state, the substrate support is separated from the second opening. At least one fixing mechanism is configured to detachably fix the second chamber to the first chamber in the first inner space. The second chamber can be transferred between the first inner space and the outside of the first chamber through the first opening when the fixing of the second chamber to the first chamber by at least one fixing mechanism is released.

In one exemplary embodiment, the second chamber may be transferred between the first inner space and the outside of the first chamber through the first opening when the fixing of the second chamber to the first chamber by at least one fixing mechanism is released in the second state.

In one exemplary embodiment, at least one actuator may include a first actuator configured to move the substrate support between a first upper position and a first lower position in the first inner space. The substrate support is located at the first upper position in the first state and located at the first lower position in the second state.

In one exemplary embodiment, at least one actuator may include a second actuator configured to move the second chamber between a second upper position and a second lower position in the first inner space. The second chamber is located at the second upper position in the first state and located at the second lower position in the second state.

Hereinafter, various exemplary embodiments will be described in detail with reference to the accompanying drawings. Further, like reference numerals will be given to like or corresponding parts throughout the drawings.

In one exemplary embodiment, a substrate processing system includes one or more process modules, a transfer module, a transfer device, and a controller. FIG. 1 shows a substrate processing system according to one exemplary embodiment. A substrate processing system PS shown in FIG. 1 includes process modules PM1 to PM6, a transfer module CTM, a transfer device CTU (see FIG. 5), and a controller MC.

The substrate processing system PS may further include stages 2a to 2d, containers 4a to 4d, an aligner AN, load-lock modules LL1 and LL2, and a transfer module TM. The substrate processing system PS may include one or more stages, one or more containers and one or more load-lock modules. Further, the substrate processing system PS may include one or more process modules.

The stages 2a to 2d are arranged along one side of a loader module LM. The containers 4a to 4d are placed on the stages 2a to 2d, respectively. Each of the containers 4a to 4d is, e.g., a container referred to as a Front Opening Unified Pod (FOUP). Each of the containers 4a to 4d is configured to accommodate substrates W therein.

The loader module LM has a chamber. A pressure in the chamber of the loader module LM is set to an atmospheric pressure. The loader module LM has a transfer device TU1. The transfer device TU1 is, e.g., a multi-joint robot and is controlled by the controller MC. The transfer device TU1 is configured to transfer the substrate W to the chamber of the loader module LM. The transfer device TU1 can transfer the substrate W between each of the containers 4a to 4d and the aligner AN, between the aligner AN and each of the load-lock modules LL1 and LL2, and between each of the load-lock modules LL1 and LL2 and each of the containers 4a to 4d. The aligner AN is connected to the loader module LM. The aligner AN is configured to adjust a position of the substrate W (calibration of the position).

Each of the load-lock modules LL1 and LL2 is disposed between the loader module LM and the transfer module TM. Each of the load-lock modules LL1 and LL2 provides a preliminary depressurization chamber.

The transfer module TM is connected to each of the load-lock modules LL1 and LL2 through gate valves. The transfer module TM has a depressurizable transfer chamber TC. The transfer module TM has a transfer device TU2. The transfer device TU2 is, e.g., a multi-joint robot and is controlled by the controller MC. The transfer device TU2 is configured to transfer the substrate W through the transfer chamber TC. The transfer device TU2 transports the substrate W between each of the load-lock modules LL1 and LL2 and each of the process modules PM1 to PM6, and between any two process modules among the process modules PM1 to PM6.

Each of the process modules PM1 to PM6 is configured to perform dedicated substrate processing. At least one of the process modules PM1 to PM6 is a substrate processing apparatus according to an exemplary embodiment to be described later.

The transfer module CTM has a chamber. The chamber of the transfer module CTM is connected to a first chamber of the substrate processing apparatus according to the exemplary embodiment through an opening formed at a sidewall of the first chamber. The transfer device CTU is, e.g., a multi-joint robot. The transfer device CTU is configured to transfer a second chamber disposed in the first chamber of the substrate processing apparatus to the chamber of the transfer module CTM. In the example shown in FIG. 1, the transfer module CTM is connected to the process module PM5. In one embodiment, the substrate processing system PS may include one or more transfer module CTMs connected to one or more process modules, respectively. In one embodiment, the transfer module TM may be used as the transfer module CTM.

The controller MC is configured to control individual components of the substrate processing system PS. The controller MC may be a computer including a processor, a storage device, an input device, a display device, and the like. The controller MC executes a control program stored in the storage device and controls the individual components of the substrate processing system PS based on a recipe data stored in the storage device. A maintenance method according to the exemplary embodiment to be described later can be performed in the substrate processing system PS by controlling the individual components of the substrate processing system PS by the controller MC.

Figure 2:
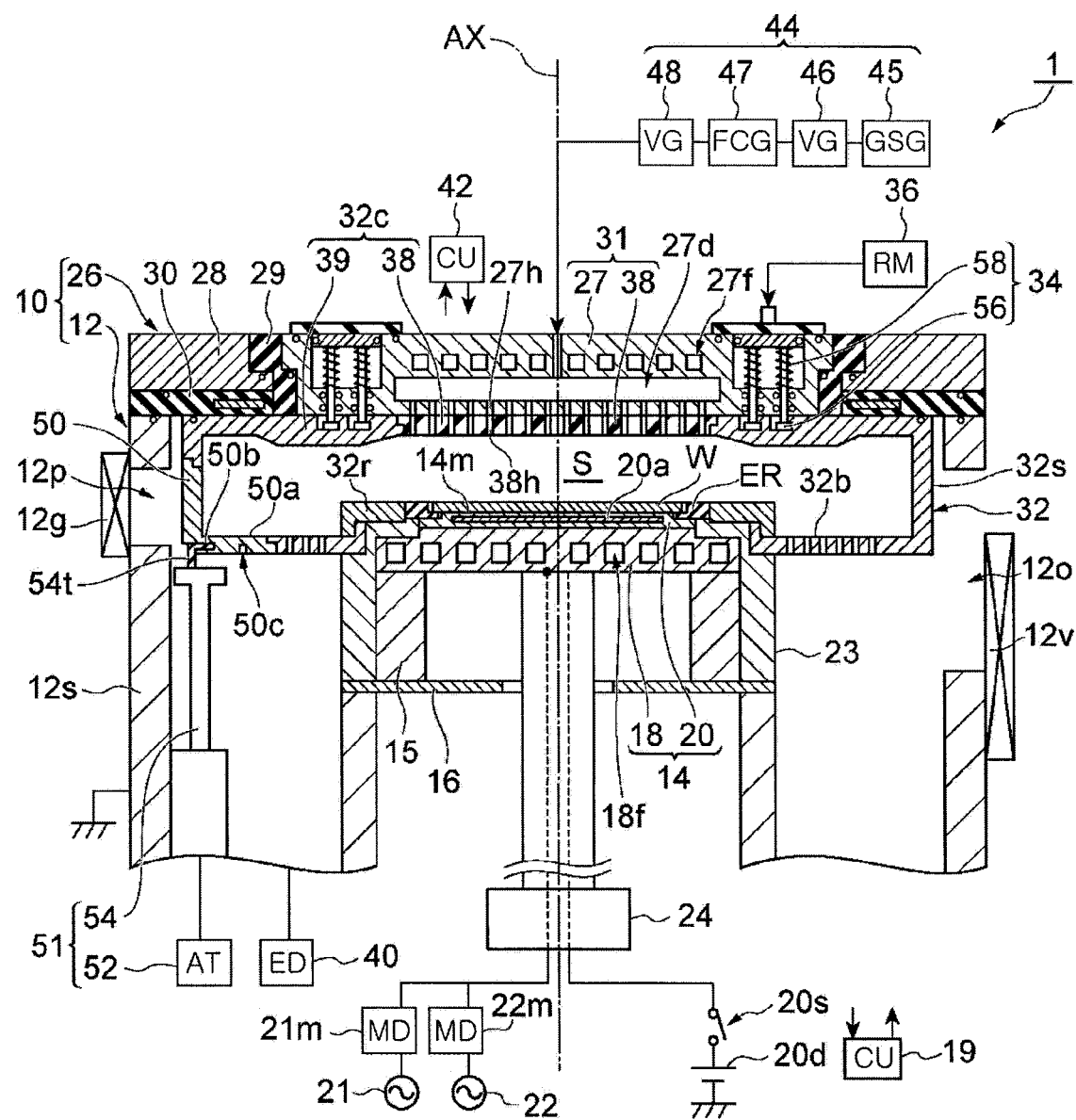
FIG. 2 schematically shows a substrate processing apparatus according to one exemplary embodiment.

Hereinafter, a substrate processing apparatus according to an exemplary embodiment will be described. FIG. 2 schematically shows a substrate processing apparatus according to one embodiment. The substrate processing apparatus 1 shown in FIG. 2 is a capacitively coupled plasma processing apparatus. The substrate processing apparatus 1 includes a first chamber 10. The first chamber 10 has an inner space. The first chamber 10 includes a chamber body 12. The chamber body 12 is electrically grounded. The chamber body 12 is made of, e.g., aluminum. A corrosion-resistant film may be formed on a surface of the chamber body 12. The corrosion-resistant film is made of, e.g., a material such as aluminum oxide or yttrium oxide.

The chamber body 12 has a sidewall 12s. The sidewall 12s has a substantially cylindrical shape. A central axis of the sidewall 12s extends in a vertical direction and is indicated by an axis AX in FIG. 2. The first chamber 10 has a substrate transfer port 12p. The substrate transfer port 12p may be disposed at the sidewall 12s. An inner space of the first chamber 10 is connected to the transfer chamber TC of the transfer module TM through the substrate transfer port 12p. The substrate transfer port 12p can be opened and closed by a gate valve 12g. The substrate W is transferred between the inside of the first chamber 10 and the outside of the first chamber 10 through the substrate transfer port 12p.

The first chamber 10 further has an opening 12o (first opening). The opening 12o may be formed at the sidewall 12s. The opening 12o has a size that allows a second chamber that will be described later to pass therethrough. The inside of the first chamber 10 (inner space or first inner space) is connected to the transfer module CTM through the opening 12o. The opening 12o can be opened and closed by a gate valve 12v.

The substrate processing apparatus 1 further includes a substrate support 14. The substrate support 14 is disposed in the first chamber 10. The substrate support 14 has a substrate support area 14m. The substrate support 14 is configured to support the substrate W placed on the substrate support area 14m. The substrate support 14 may be supported by a support portion 15. The support portion 15 has a substantially cylindrical shape. The support portion is made of, e.g., an insulator such as quartz. The support portion 15 may extend upward from a bottom plate 16.

The substrate support 14 may include a lower electrode 18 and an electrostatic chuck 20. The lower electrode 18 has a substantially disc shape. A central axis of the lower electrode 18 substantially coincides with the axis AX. The lower electrode 18 is made of a conductor such as aluminum. The lower electrode 18 has therein a flow path 18f. The flow path 18f extends, e.g., in a spiral shape. The flow path 18f is connected to a chiller unit (CU) 19. The chiller unit 19 is disposed outside the first chamber 10. The chiller unit 19 supplies a coolant to the flow path 18f. The coolant supplied to the flow path 18f is returned to the chiller unit 19.

The substrate processing apparatus 1 may further include a first radio frequency power supply 21 and a second radio frequency power supply 22. The first radio frequency power supply 21 generates a first radio frequency power. The first radio frequency power has a frequency suitable for generating plasma. A frequency of the first radio frequency power is, e.g., 27 MHz or higher. The first radio frequency power supply 21 is electrically connected to the lower electrode 18 through a matching device (MD) 21m. The matching device 21m has a matching circuit for matching an impedance of a load side (the lower electrode 18 side) and an output impedance of the first radio frequency power supply 21. The first radio frequency power supply 21 may be connected to the upper electrode to be described later through the matching device 21m, instead of the lower electrode 18.

The second radio frequency power supply 22 generates a second radio frequency power. The second radio frequency power has a frequency suitable for attracting ions into the substrate W. A frequency of the second radio frequency power is, e.g., 13.56 MHz or lower. The second radio frequency power supply 22 is electrically connected to the lower electrode 18 through a matching device (MD) 22m. The matching device 22m has a matching circuit for matching the impedance of the load side (the lower electrode 18 side) and an output impedance of the second radio frequency power supply 22.

The electrostatic chuck 20 is disposed on the lower electrode 18. The electrostatic chuck 20 has a main body and an electrode 20a. The main body of the electrostatic chuck 20 has a substantially disc shape. A central axis of electrostatic chuck 20 substantially coincides with the axis AX. The main body of the electrostatic chuck 20 is made of ceramic. An upper surface of the main body of the electrostatic chuck 20 constitutes the above-described substrate support area 14m. The electrode 20a is a film made of a conductor. The electrode 20a is embedded in the main body of the electrostatic chuck 20. The electrode 20a is connected to a DC power supply 20d through a switch 20s. When a voltage from the DC power supply 20d is applied to the electrode 20a, an electrostatic attractive force is generated between the electrostatic chuck 20 and the substrate W. The substrate W is attracted to and held by the electrostatic chuck 20 by the generated electrostatic attractive force. The substrate processing apparatus 1 may include a gas line for supplying a heat transfer gas (e.g., helium gas) to a gap between the electrostatic chuck 20 and the backside of the substrate W.

The substrate support 14 may support an edge ring ER. The substrate W is placed on the electrostatic chuck 20 in a region surrounded by the edge ring ER. The edge ring ER is made of, e.g., silicon, quartz, or silicon carbide.

The substrate support 14 may further has an outer peripheral portion 23. The outer peripheral portion 23 extends along outer peripheries of the lower electrode 18, the electrostatic chuck 20, and the support portion 15. The outer peripheral portion 23 is made of an insulator such as quartz.

The substrate processing apparatus 1 further includes an actuator 24. The actuator 24 is configured to move the substrate support 14 between a first position (first upper position) and a second position (first lower position). The first position is located above the second position. The actuator 24 may have a support portion and a driving unit. The support portion of the actuator 24 supports the substrate support 14 and extends downward. The driving unit of the actuator 24 generates a power for moving the substrate support 14 through the support portion. The driving unit of the actuator 24 includes, e.g., a motor.

The first chamber 10 may further has a ceiling portion 26. The ceiling portion 26 is disposed on the sidewall 12s to close an upper opening of the chamber body 12. The ceiling portion 26 extends upward from the celling portion of the second chamber to be described later.

In one embodiment, the ceiling portion 26 may include a backing portion 27, an annular portion 28, an annular portion 29, and a heater unit 30. The backing portion 27 is disposed above the substrate support 14. The backing portion 27 forms a part of the upper electrode 31. The upper electrode 31 is disposed above the substrate support 14.

The annular portion 28 has a substantially annular shape. The annular portion 28 is made of a metal such as aluminum. The annular portion 28 is disposed on the sidewall 12s via the heater unit 30. The heater unit 30 has therein a heater. The annular portion 29 has a substantially annular shape. The annular portion 29 is disposed between the backing portion 27 and the annular portion 28. The annular portion 29 is made of an insulator such as quartz.

The substrate processing apparatus 1 further includes a second chamber 32. The second chamber 32 is disposed in the first chamber 10. The second chamber 32 may have a second inner space and a second opening. The second inner space is an inner space of the second chamber 32, and the second opening is continuous with the second chamber 32. The second opening may be formed at a lower portion of the second chamber 32.

The second chamber 32 forms a processing space S, i.e., the substrate processing space, together with the substrate support 14 when the substrate support 14 is located at the first position. When the substrate support 14 is located at the first position, the first state in which the second opening of the second chamber 32 is closed by the substrate support 14 is obtained. In the first state, the second inner space serves as a substrate processing space. On the other hand, when the substrate support 14 is moved to the second position, a second state in which the substrate support 14 is separated from the second opening is obtained.

The second chamber 32 is detachably fixed to the first chamber 10. Further, the second chamber 32 can be transferred between the inside and the outside of the first chamber 10 through the opening 12o. The second chamber 32 may be made of a conductor such as aluminum. A corrosion-resistant film may be formed on the surface of the second chamber 32. The corrosion-resistant film is made of a material such as aluminum oxide or yttrium oxide.

The substrate processing apparatus 1 further includes at least one fixing mechanism 34 and a release mechanism (RM) 36. The fixing mechanism 34 is configured to be detachably fix the second chamber 32 to the first chamber 10 in the inner space of the first chamber 10. The release mechanism 36 is configured to release the fixing of the second chamber 32 by the fixing mechanism 34. The fixing mechanism 34 and the release mechanism 36 will be described in detail later.

In one embodiment, the second chamber 32 may have a ceiling portion 32c, a side portion 32s, a baffle 32b, and one or more ring members 32r. The ceiling portion 32c extends upward from the processing space S. In one embodiment, the ceiling portion 32c may include a ceiling plate 38 and an annular portion 39. The ceiling plate 38 has a substantially disc shape. The annular portion 39 has a substantially annular shape. The annular portion 39 extends in a circumferential direction around the axis AX, and extends in a radial direction from an outer edge of the ceiling plate 38. The annular portion 39 supports the ceiling plate 38. The outer edge of the ceiling plate 38 is disposed on an inner edge of the annular portion 39. The above-described heater unit 30 is also disposed between the annular portion 39 and the annular portion 28.

The side portion 32s extends laterally from the processing space S. The side portion 32s has a substantially cylindrical shape. In one embodiment, the side portion 32s is continuous with the outer edge of the annular portion 39 of the ceiling portion 32c and extends downward from the outer edge of the annular portion 39.

The baffle 32b extends between the side portion 32s and the substrate support 14. The baffle 32b is disposed to surround the substrate support 14 when the substrate support 14 is located at the first position. The baffle 32b has a substantially annular shape. The baffle 32b has a plurality of through-holes. The substrate processing apparatus 1 may further include an exhaust device (ED) 40. The exhaust device 40 includes a pressure regulator such as an automatic pressure control valve, and a depressurization pump such as a turbo molecular pump. The exhaust device 40 is connected to a bottom portion of the first chamber 10 at a position lower than the baffle 32b.

The ring member 32r has a substantially annular shape. The ring member 32r is disposed to surround the substrate W placed on the substrate support 14 when the substrate support 14 is located at the first position. In other words, the inner edge of the ring member 32r surrounds the substrate support area 14m via the edge ring ER. The ring member 32r is supported on the inner edge of the baffle 32b.

The ceiling plate 38 and the backing portion 27 form the upper electrode 31 in a state where the second chamber 32 is fixed to the first chamber 10. In this state, the upper surface of the ceiling plate 38 is brought into contact with a bottom surface of the backing portion 27. In one embodiment, the upper electrode 31 may serve as a shower head. The ceiling plate 38 has a plurality of gas injection holes 38h. The gas injection holes 38h penetrate through the ceiling plate 38 in a plate thickness direction (the vertical direction). The ceiling plate 38 may be made of silicon. Alternatively, the ceiling plate 38 may be obtained by forming a corrosion-resistant film on a surface of a member made of a conductor such as aluminum. The corrosion-resistant film is made of a material such as aluminum oxide or yttrium oxide.

The backing portion 27 is made of, e.g., aluminum. The backing portion 27 has therein a flow path 27f. The flow path 27f extends in a spiral shape in the backing portion 27, for example. The flow path 27f is connected to a chiller unit (CU) 42. The chiller unit 42 is disposed outside the first chamber 10. The chiller unit 42 supplies the coolant to the flow path 27f. The coolant supplied to the flow path 27f is returned to the chiller unit 42.

The backing portion 27 has therein a gas diffusion space 27d. Further, the backing portion 27 has a plurality of holes 27h. The holes 27h extend downward from the gas diffusion space 27d. The holes 27h are connected to the gas injection holes 38h, respectively, in a state where the second chamber 32 is fixed to the first chamber 10. A gas supply unit 44 is connected to the gas diffusion space 27d.

The gas supply unit 44 may include a gas source group (GSG) 45, a valve group (VG) 46, a flow controller group (FCG) 47, and a valve group (VG) 48. The gas source group 45 includes a plurality of gas sources. Each of the valve group 46 and the valve group 48 includes a plurality of valves. The flow controller group 47 includes a plurality of flow controllers. Each of the flow controllers is a mass flow controller or a pressure-control type flow controller. The gas sources of the gas source group 45 are connected to the gas diffusion space 27d via the corresponding valves of the valve group 46, the corresponding flow controllers of the flow controller group 47, and the corresponding valves of the valve group 48. In the substrate processing apparatus 1, a gas from one or more gas sources selected from the plurality of gas sources in the gas source group 45 passes through the gas diffusion space 27d and the holes 27h and is supplied to the processing space S from the gas injection holes 38h.

In one embodiment, the side portion 32s of the second chamber 32 may have an opening between the substrate transfer port 12p and the inside of the second chamber 32.

A movable shutter 50 for closing the opening may be formed at the side portion 32s. The substrate processing apparatus 1 may further include a driving mechanism 51 for moving the movable shutter 50. The driving mechanism 51 is configured to move the movable shutter 50 between a region (i.e., the opening of the side portion 32s) between the substrate transfer port 12p and the inside of the second chamber 32 and a position retracted from the region. In other words, the driving mechanism 51 is configured to move the movable shutter 50 between an open position and a closed position. The open position is located above the closed position.

In one embodiment, the driving mechanism 51 may include an actuator (AT) 52 and a support portion 54. The actuator 52 is configured to generate a power for moving the movable shutter 50 between the open position and the closed position. The actuator 52 may include, e.g., a motor. The support portion 54 supports the movable shutter 50. The support portion 54 has, e.g., a rod shape and extends in the vertical direction. An upper end 54t of the support portion 54 has a horizontally protruding part. The movable shutter 50 has a part 50a extending substantially horizontally from the baffle 32b. The part 50a has a recess 50b. The recess 50b is formed such that the protruding part of the upper end 54t of the support portion 54 can be fitted therein. The part 50a further has a recess 50c. The recess 50c is formed such that a protruding part of an arm (to be described later) of the transfer device CTU can be fitted therein. The support portion 54 is connected to the actuator 52. The actuator 52 moves the movable shutter 50 via the support portion 54.

Hereinafter, the fixing mechanism 34 and the release mechanism 36 will be described. In one embodiment, the fixing mechanism 34 detachably fixes the ceiling portion 32c of the second chamber 32 to the ceiling portion 26 of the first chamber 10.

Figure 3:
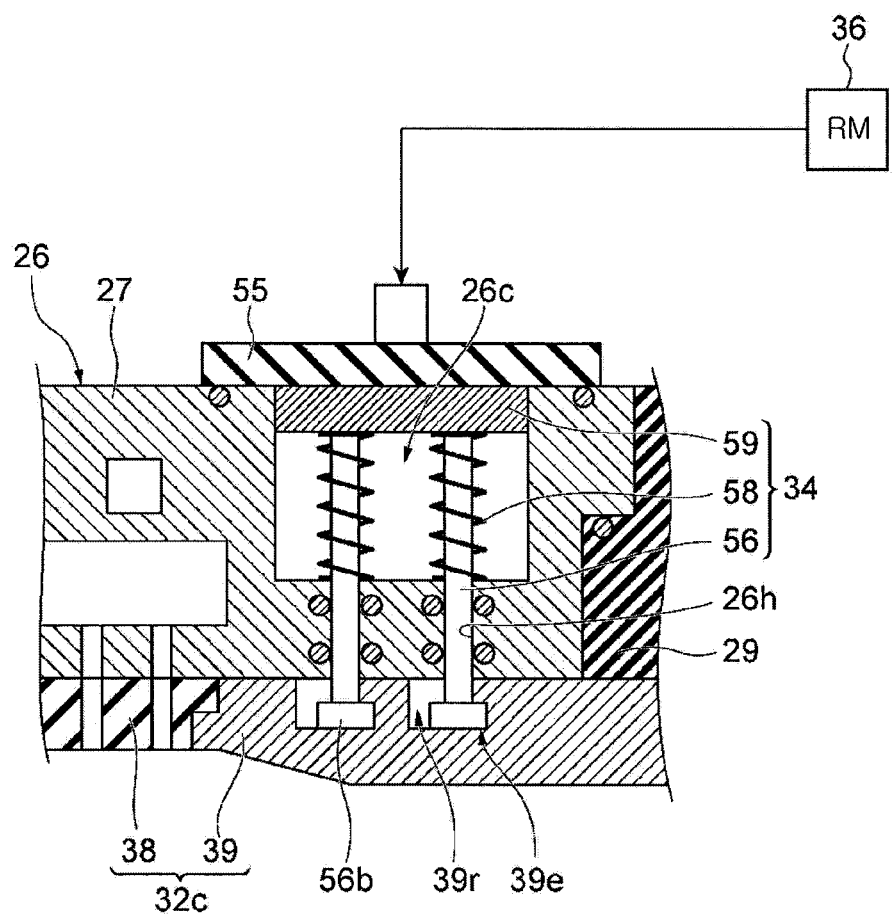
FIG. 3 shows a fixing mechanism and a release mechanism according to one exemplary embodiment.

FIG. 3 shows a fixing mechanism and a release mechanism according to one exemplary embodiment. In one embodiment, the fixing mechanism 34 includes a plurality of support portions 56 and a plurality of biasing members 58. The fixing mechanism 34 may further include a plate 59. The fixing mechanism 34 may include one support portion 56 and one biasing member 58.

Each of the support portions 56 has an engaging member 56b. The engaging member 56b is configured to be engaged with the ceiling portion 32c of the second chamber 32. In one embodiment, the engaging member 56b is formed such that the ceiling portion 32c is suspended therefrom. The biasing members 58 are configured to bias the engaging member 56b upward in a state where the engaging member 56b is engaged with the ceiling portion 32c of the second chamber 32. In other words, the biasing members 58 are configured to bias the ceiling portion 32c to the ceiling portion 26 of the first chamber 10.

In one embodiment, the ceiling portion 26 of the first chamber 10 has a cavity 26c. The cavity 26c may extend in the circumferential direction around the axis AX. The cavity 26c is closed by a lid 55. The lid 55 is disposed on the ceiling portion 26 of the first chamber 10 to close the cavity 26c. The ceiling portion 26 further has a plurality of holes 26h. The holes 26h may be arranged at an equal interval along a plurality of concentric circles about the axis AX. The holes 26h extend downward from the cavity 26c and are opened toward the ceiling portion 32c. The ceiling portion 32c has a plurality of recesses 39r. The recesses 39r are connected to the holes 26h, respectively, in a state where the second chamber 32 is fixed to the first chamber 10.

In one embodiment, each of the support portions 56 has a rod shape. The engaging member 56b of each of the support portions 56 projects in the horizontal direction. A bottom portion of each of the recesses 39r has an extension portion 39e. The extension portion 39e is formed such that the engaging member 56b of the corresponding support portion among the plurality of support portions 56 can be fitted therein. In one example, each of the support portions 56 may be a screw, and the engaging member 56b of each of the support portions 56 may be a head of a screw.

The support portions 56 extend downward from the cavity 26c through the holes 26h, respectively. In a state where the ceiling portion 32c is suspended from the support portions 56, the engaging members 56b of the support portions 56 are arranged in the recesses 39r and the extension portions 39e thereof, respectively.

The upper ends of the support portions 56 are fixed to the plate 59 in the cavity 26c. The biasing members 58 are arranged in the cavity 26c. The biasing members 58 are arranged between the surface of the ceiling portion 26 that defines the cavity 26c and the plate 59. In one embodiment, each of the biasing members 58 is a spring (e.g., a coil spring). The biasing members 58 are disposed to surround the support portions 56 in the cavity 26c, respectively.

In one embodiment, the release mechanism 36 includes an air supply device. The air supply device applies an air pressure that pulls the ceiling portion 32c downward from the ceiling portion 26 of the first chamber 10 to release the fixing of the ceiling portion 32c by the fixing mechanism 34. The air supply device of the release mechanism 36 may supply air to the gap between the lid 55 and the plate 59. When air is supplied to the gap between the lid 55 and the plate 59, the plate 59 and the support parts 56 are moved downward, and the ceiling portion 32c is separated downward from the ceiling portion 26 of the first chamber 10. In other words, the fixing of the ceiling portion 32c by the fixing mechanism 34 is released. In a state where the fixing of the ceiling portion 32c by the fixing mechanism 34 is released, the fixing of the second chamber 32 to the first chamber 10 is released, and the second chamber 32 can be transferred from the inside of the first chamber 10 to the outside of the chamber 10.

Hereinafter, a maintenance method according to one exemplary embodiment will be described with reference to FIGS. 4 to 12. Further, the control operation of the controller MC for the maintenance method will be described. FIGS. 4 to 12 show a state of the substrate processing system during execution of the maintenance method according to one exemplary embodiment. In the maintenance method, the second chamber 32 is separated for maintenance from the first chamber 10 and transferred to the transfer module CTM.

Figure 4:
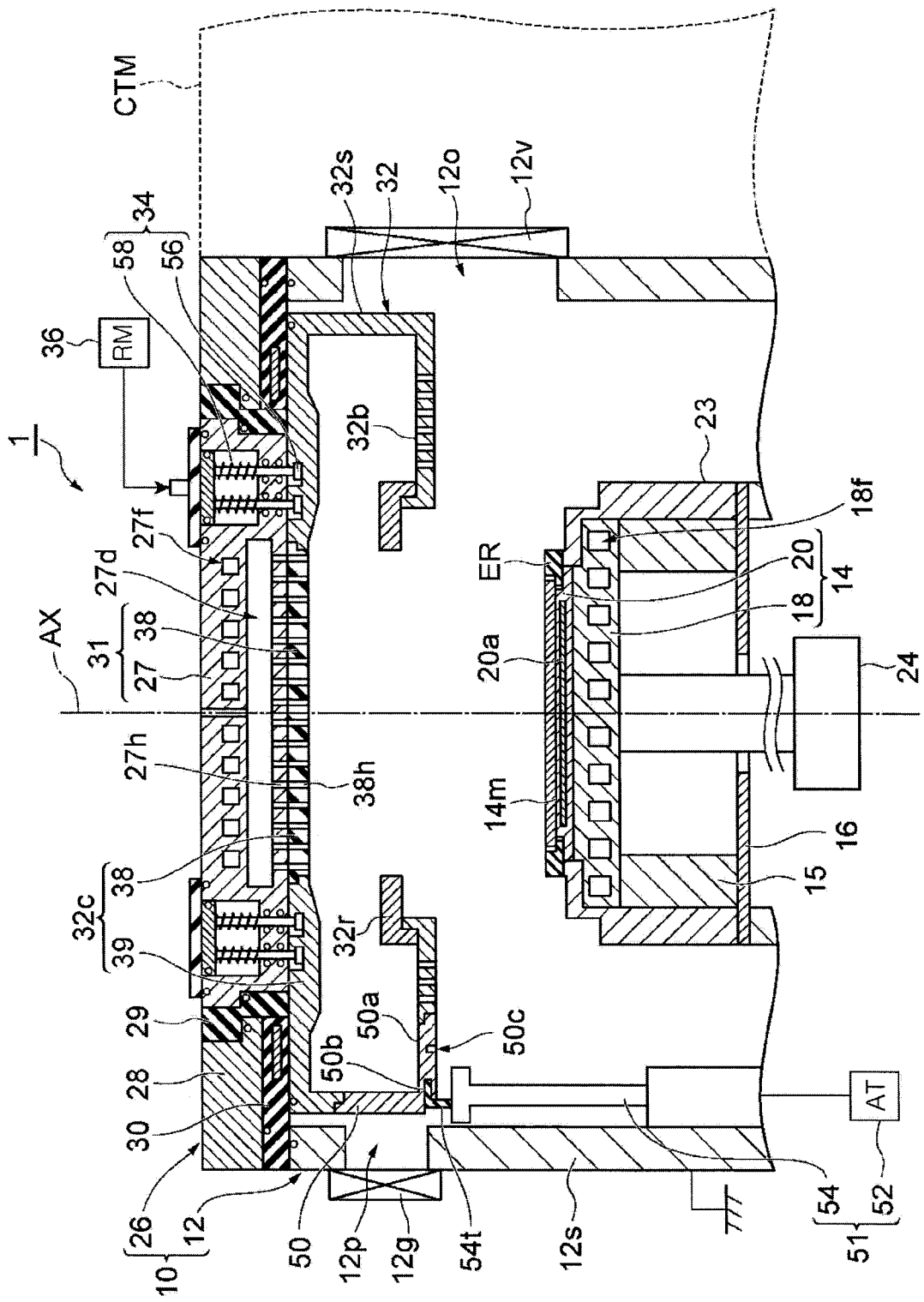
FIGS. 4 to 12 show states of the substrate processing system during execution of a maintenance method according to one exemplary embodiment.

The above-described first state is obtained before the maintenance method is performed. In the first state, the second chamber 32 is located at the second upper position. In the maintenance method, first, the substrate support 14 is pulled downward from the second chamber 32 as shown in FIG. 4. In other words, the substrate support 14 is moved from the first position (first upper position) to the second position (first lower position) to obtain the second state. The actuator 24 is controlled by the controller MC to pull the substrate support 14 downward from the second chamber 32.

Figure 5:
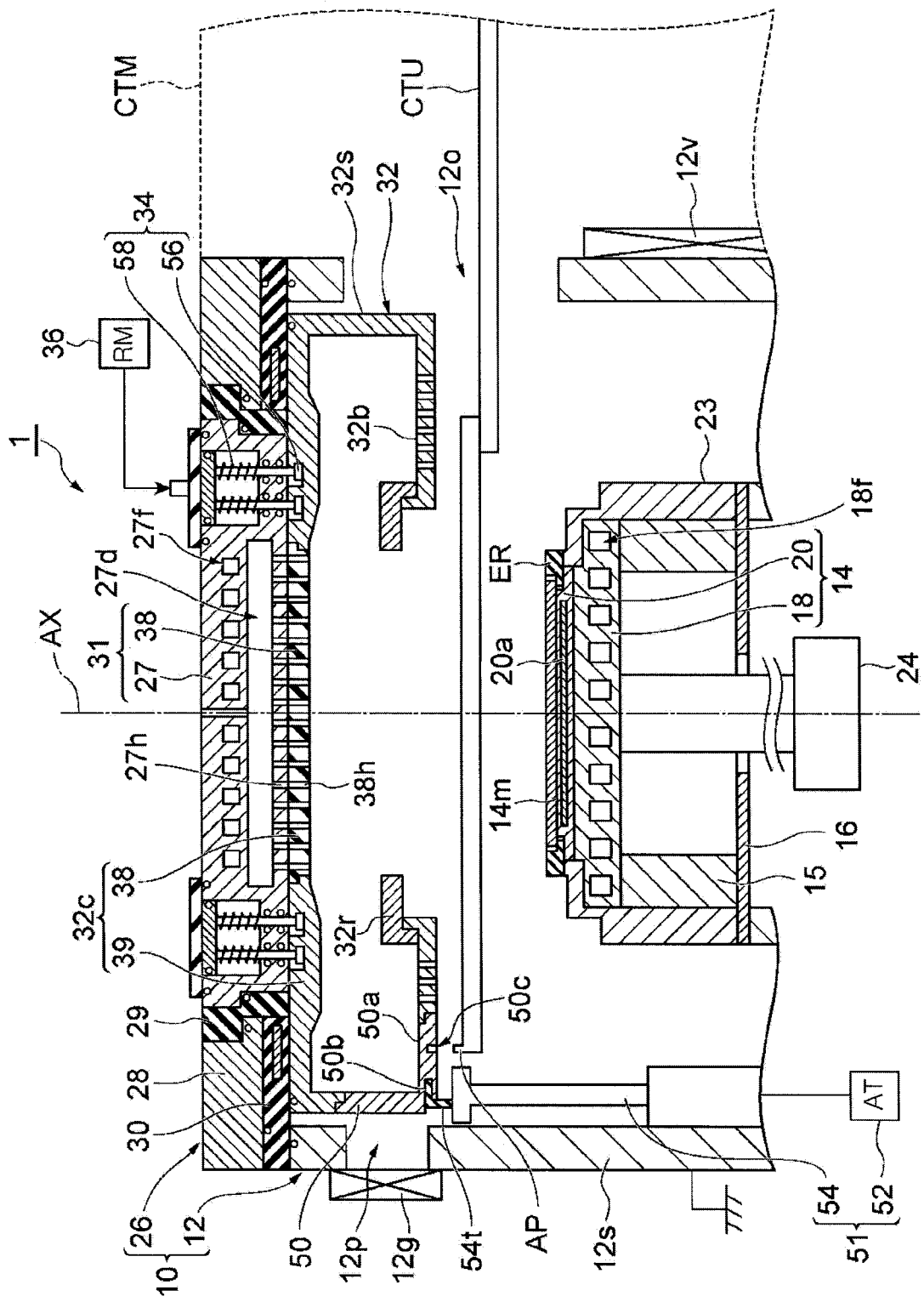

Then, in the maintenance method, as shown in FIG. 5, the gate valve 12v is opened, and the arm of the transfer device CTU is inserted into the first chamber 10 from the transfer module CTM through the opening 12o. The arm of the transfer device CTU is inserted into the first chamber 10 such that the protruding part AP thereof is positioned below the recess 50c of the movable shutter 50. The controller MC controls the transfer device CTU to insert the arm thereof into the first chamber 10.

Next, in the maintenance method, the movable shutter 50 is delivered from the support portion 54 of the driving mechanism 51 to the arm of the transfer device CTU. Therefore, the driving mechanism 51 and the transfer device CTU are controlled by the controller MC.

Figure 6:
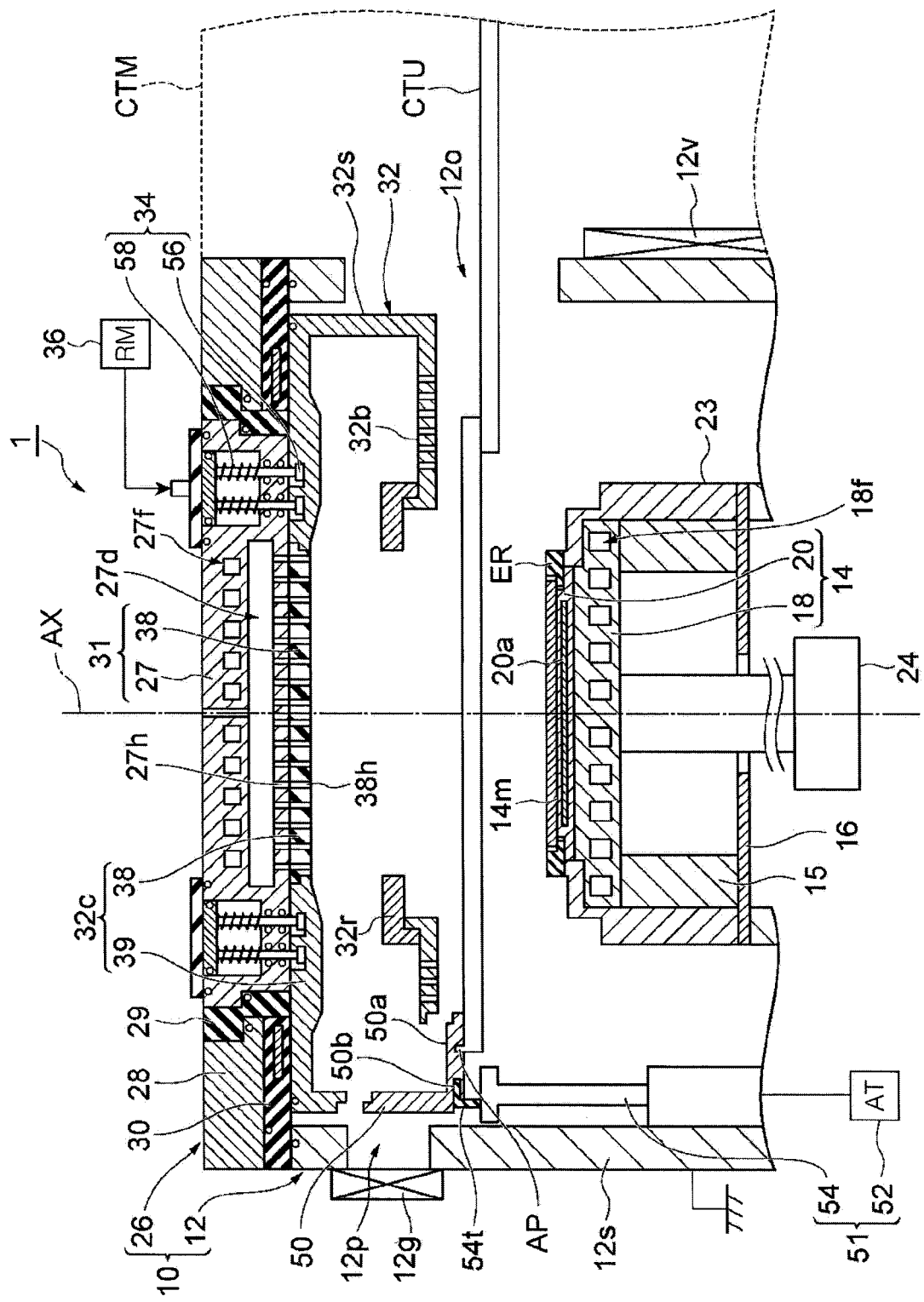

In order to transfer the movable shutter 50 from the support portion 54 of the driving mechanism 51 to the arm of the transfer device CTU, the movable shutter 50 is moved downward as shown in FIG. 6. The movable shutter 50 is moved downward by the driving mechanism 51 such that the protruding part AP of the arm of the transfer device CTU is fitted in the recess 50c. The controller MC controls the driving mechanism 51 to move the movable shutter 50 downward. The movable shutter 50 is supported by the arm of the transfer device CTU in a state where the protruding part AP is fitted in the recess 50c.

Figure 7:
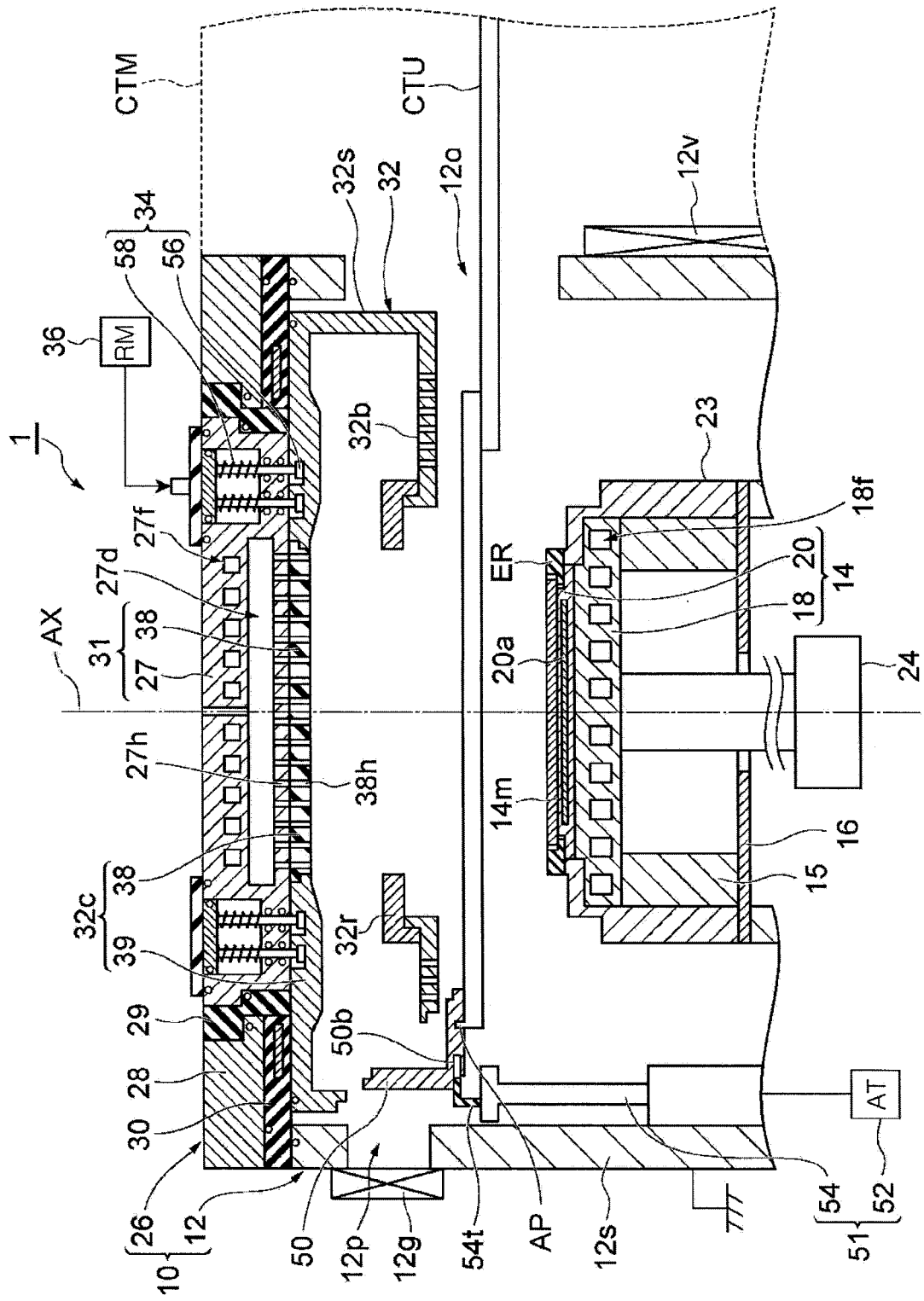

Next, in order to transfer the movable shutter 50 from the support portion 54 of the driving mechanism 51 to the arm of the transfer device CTU, the movable shutter 50 supported by the arm of the transfer device CTU is moved in the horizontal direction as shown in FIG. 7. The movable shutter 50 is horizontally moved by the transfer device CTU to separate the protruding part of the upper end 54t of the support portion 54 from the recess 50b of the movable shutter 50. The controller MC controls the transfer device CTU to move the movable shutter 50 supported by the arm in the horizontal direction.

Figure 8:
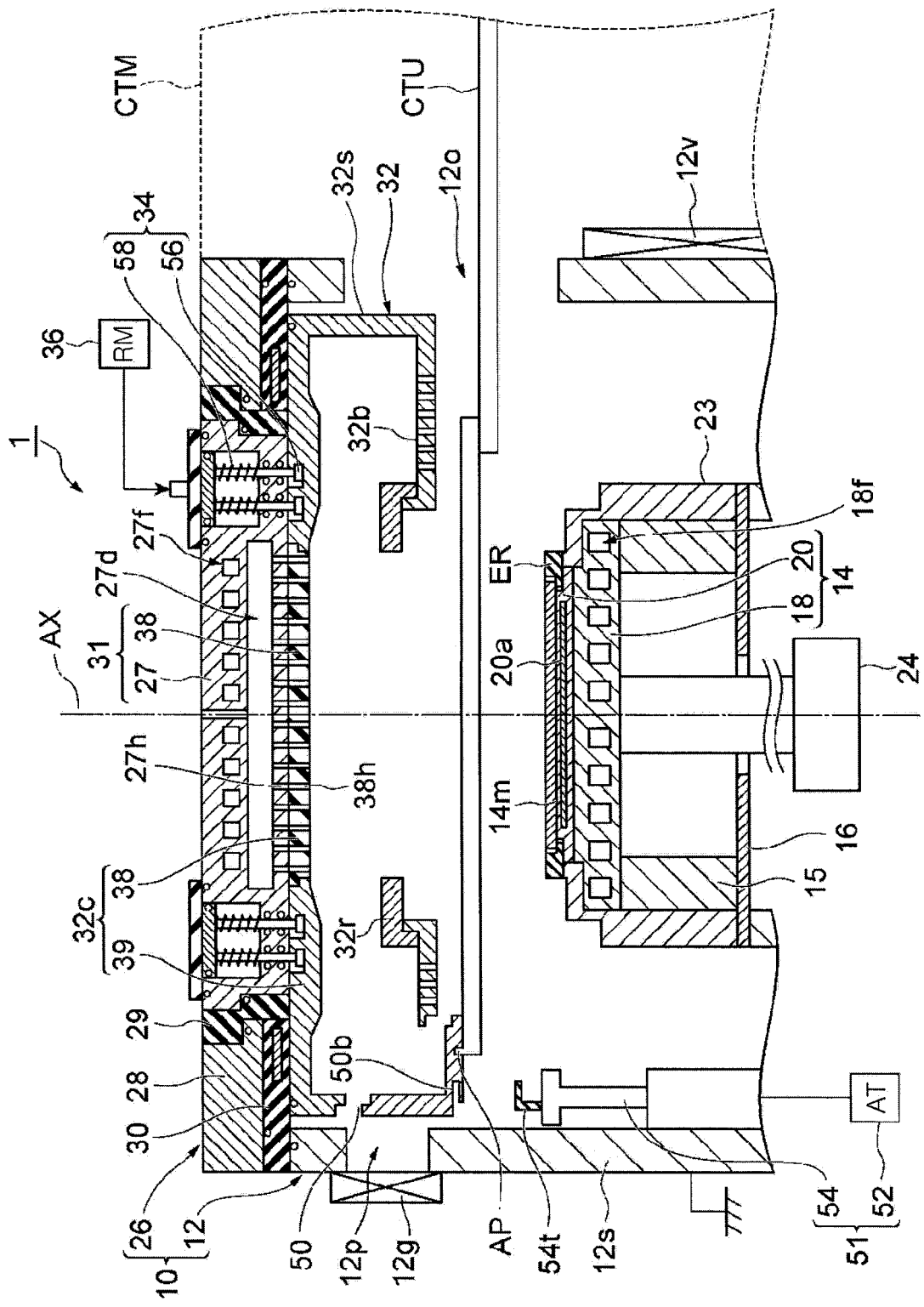

Next, in the maintenance method, as shown in FIG. 8, the support portion 54 is moved downward to avoid interference with the movable shutter 50. The controller MC controls the driving mechanism 51 to move the support portion 54 downward. Next, the movable shutter 50 is moved in the horizontal direction by the transfer device CTU to return to the original position shown in FIG. 6. The controller MC controls the transfer device CTU to move the movable shutter 50 in the horizontal direction.

Figure 9:
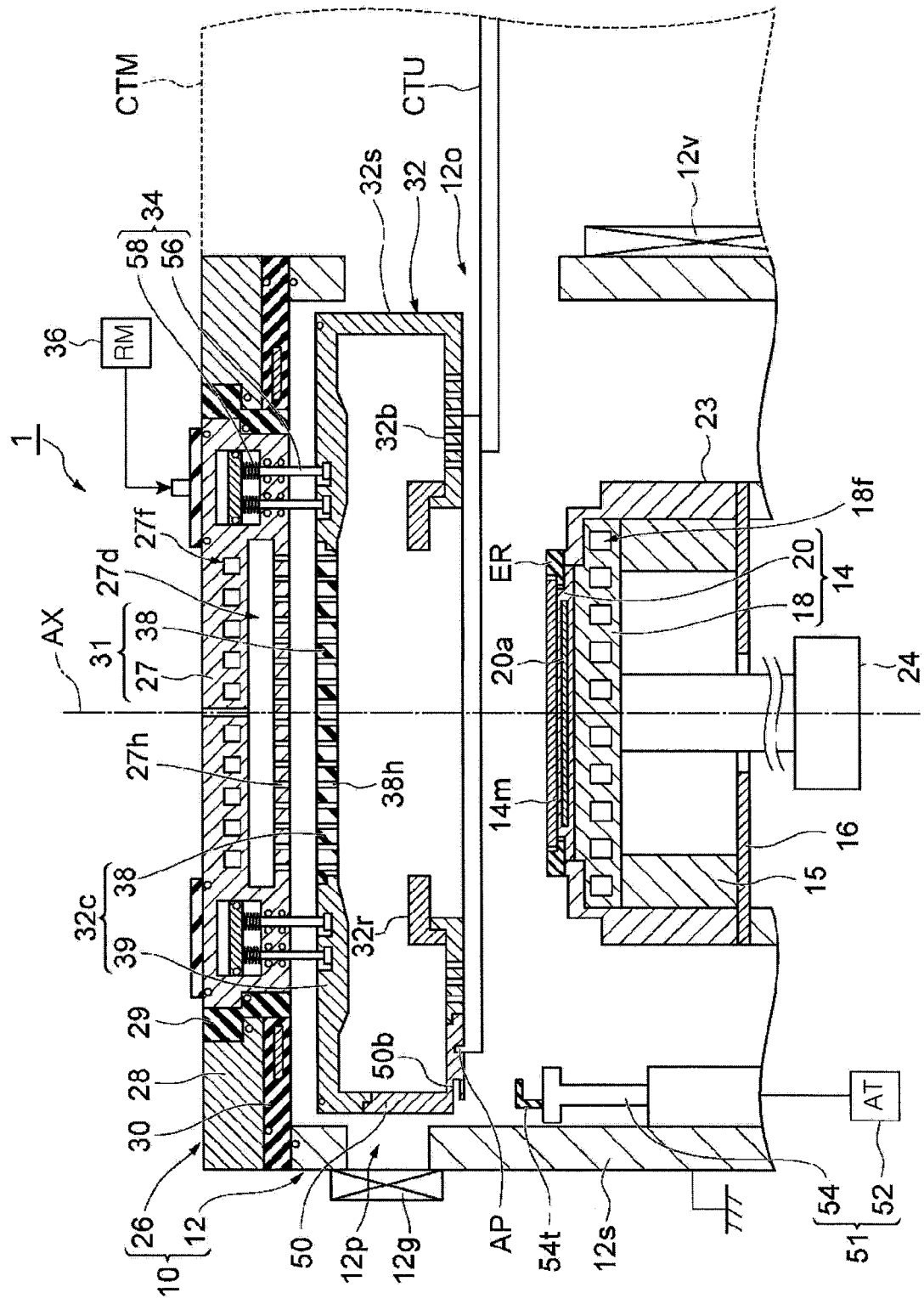

Next, in the maintenance method, the fixing of the second chamber 32 by the fixing mechanism 34 is released to deliver the second chamber 32 (the other portion of the second chamber 32 except the movable shutter 50) to the arm of the transfer device CTU. Specifically, as shown in FIG. 9, the second chamber 32 (the other portion of the second chamber 32 except the movable shutter 50) is moved downward to the second chamber 32 to release the fixing of the first chamber 10 to the second chamber 32. The second chamber 32 is moved downward by the release mechanism 36. The controller MC controls the release mechanism 36 to release the fixing of the second chamber 32 by the fixing mechanism in order to deliver the other portion of the second chamber 32 to the transfer device CTU.

Figure 10:
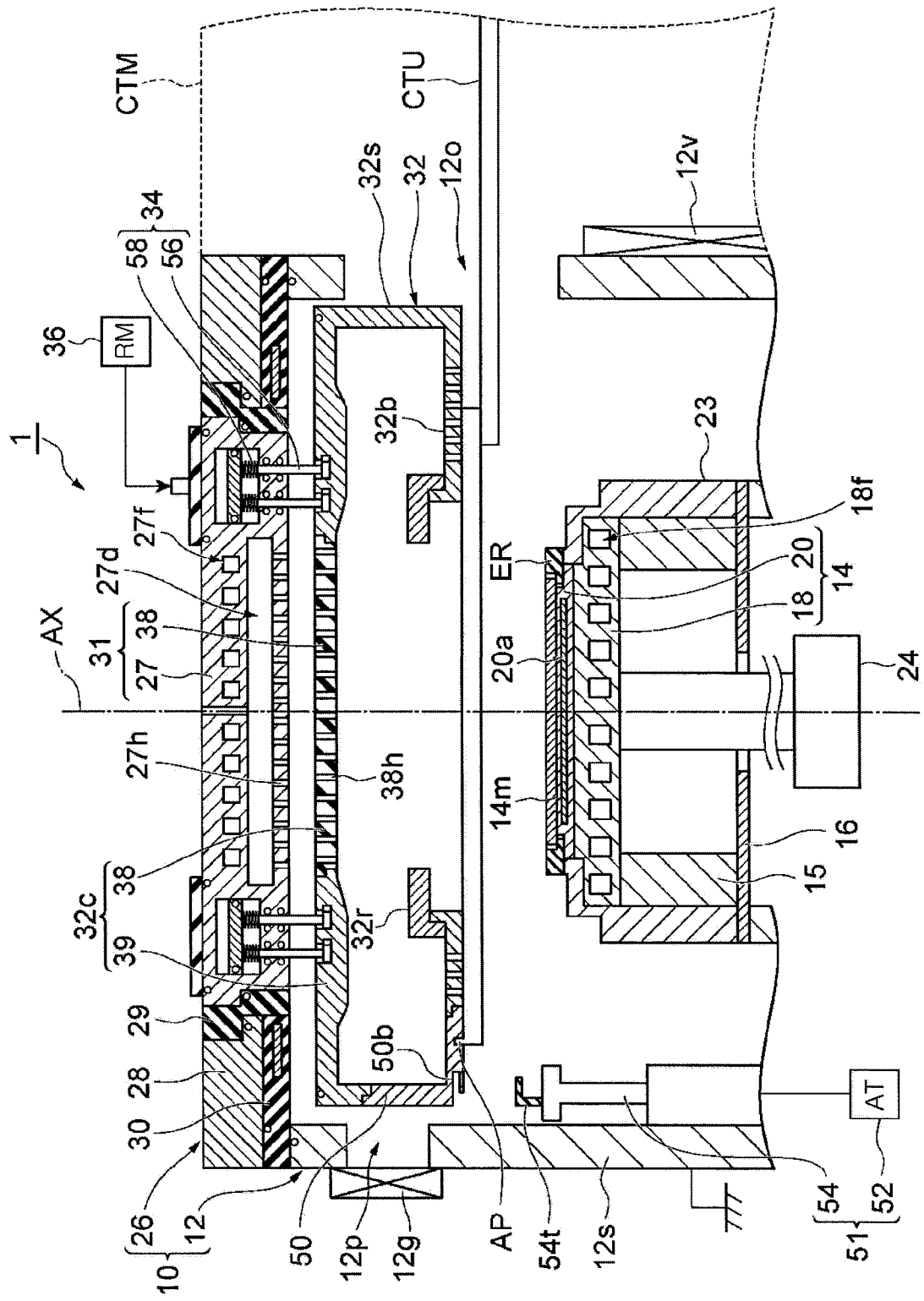

Next, in the maintenance method, the second chamber 32 is moved horizontally. As shown in FIG. 10, the second chamber 32 is horizontally moved by the transfer device CTU to separate the engaging members 56b of the support portions 56 from the extension portions 39e of the recesses 39r. The controller MC controls the transfer device CTU to move the second chamber 32 in the horizontal direction.

Figure 11:
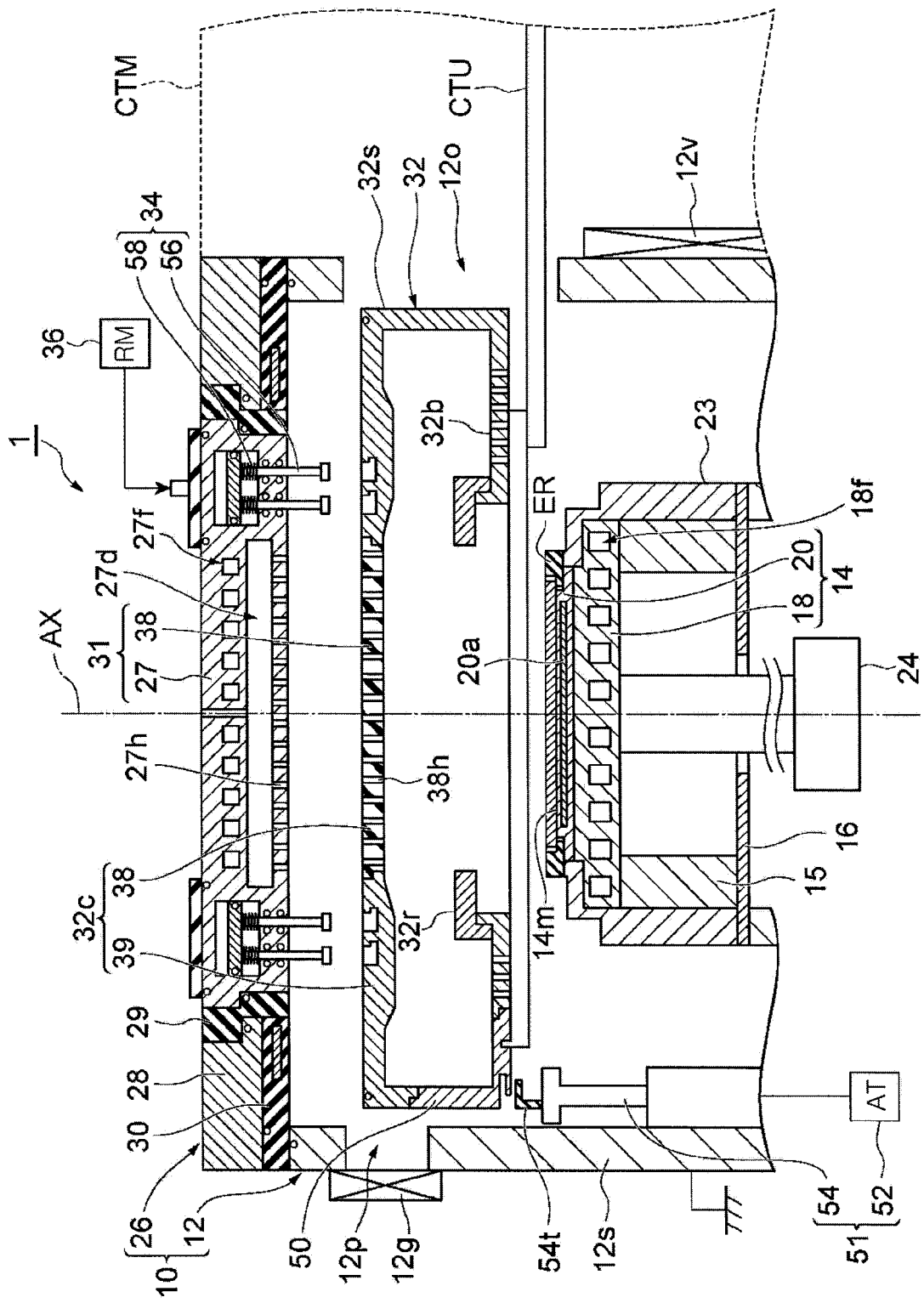

Next, in the maintenance method, the second chamber 32 is moved downward. As shown in FIG. 11, the second chamber is moved downward by the transfer device CTU to be transferred from the inside of the first chamber 10 to the transfer module CTM through the opening 12o. In other words, the second chamber 32 is moved to the second lower position. The controller MC controls the transfer device CTU to move the second chamber 32 downward.

Figure 12:
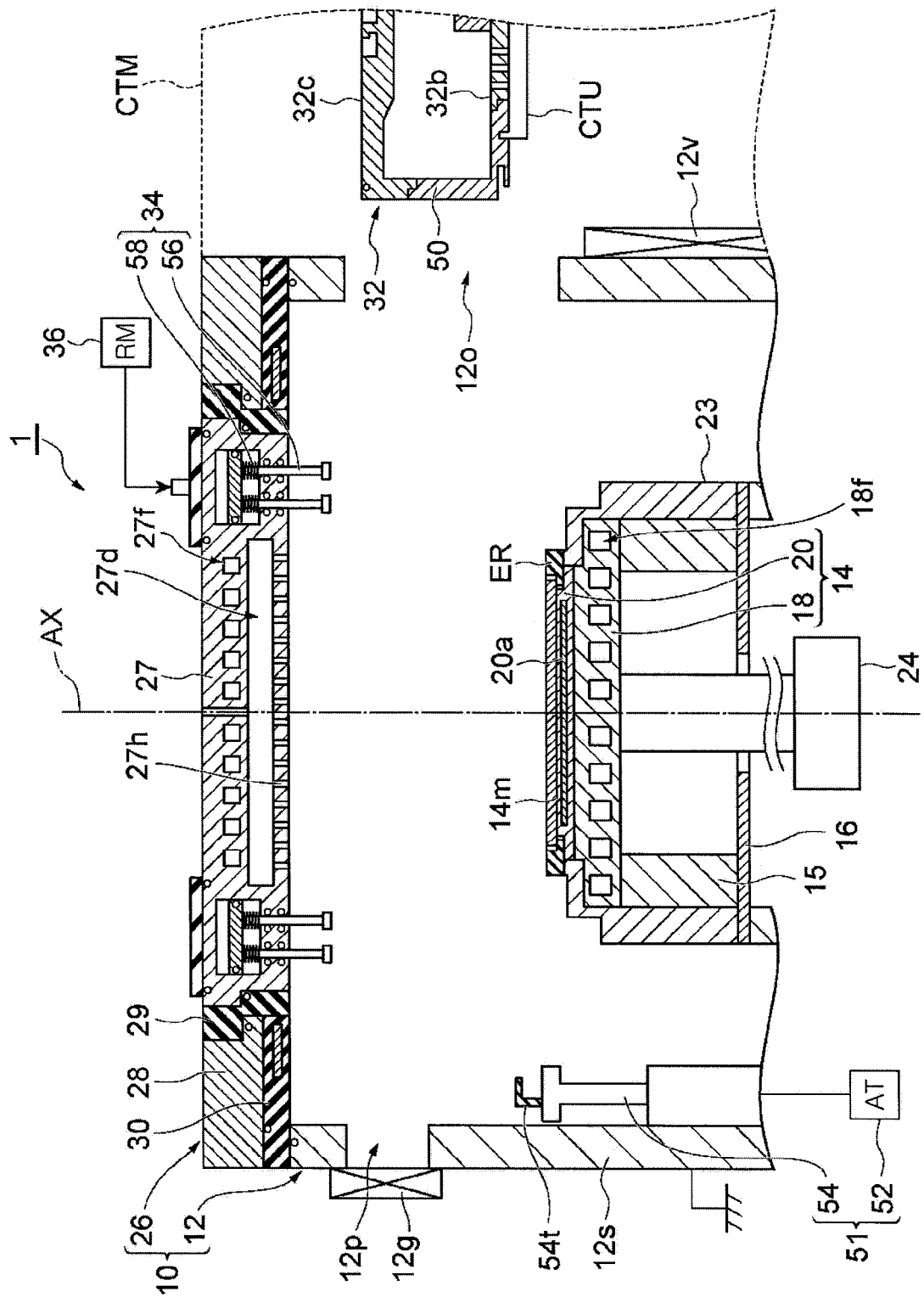

Next, in the maintenance method, as shown in FIG. 12, the second chamber 32 is transferred from the inside of the first chamber 10 to the transfer module CTM through the opening 12o by the transfer device CTU. The controller MC controls the transfer device CTU to transfer the second chamber 32 from the inside of the first chamber 10 to the transfer module CTM.

As described above, the substrate W is processed in the second chamber 32. The second chamber 32 is disposed in the first chamber 10 and fixed to the first chamber 10. The fixing of the second chamber 32 to the first chamber 10 can be released using the release mechanism 36. Further, in a state where the fixing of the second chamber 32 to the first chamber 10 is released, the second chamber 32 can be transferred to the outside of the first chamber 10 through the opening 12o formed at the sidewall of the first chamber 10. Therefore, it is possible to facilitate the maintenance of the chamber that defines the processing space S where the substrate W is processed, i.e., the second chamber 32. Further, in accordance with the substrate processing system PS and the above-described maintenance method, the second chamber 32 can be automatically unloaded from the inside of the first chamber 10. Therefore, a non-operating period of the substrate processing system PS due to the maintenance (e.g., replacement) of the second chamber 32 is shortened.

Figure 13:
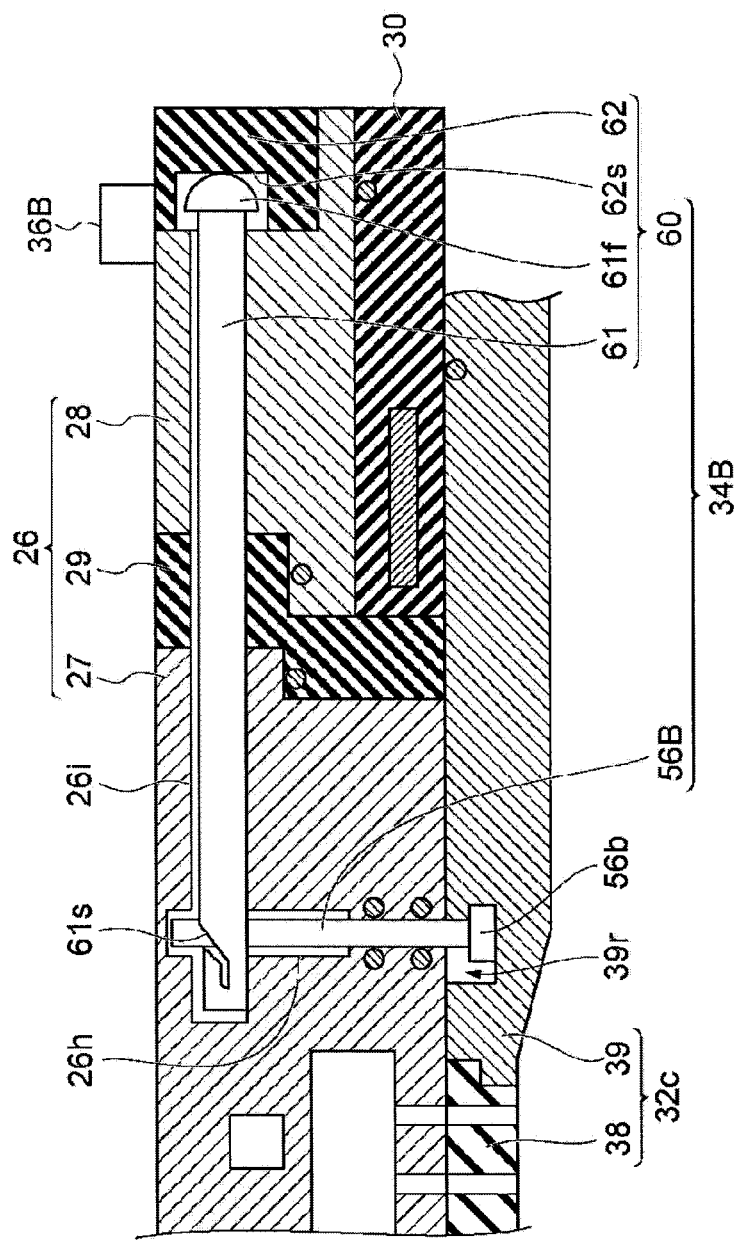
FIG. 13 shows a fixing mechanism and a release mechanism according to another exemplary embodiment.

Hereinafter, FIG. 13 will be referred to. FIG. 13 shows a fixing mechanism and a release mechanism according to another exemplary embodiment. The substrate processing apparatus 1 may include a fixing mechanism 34B and a release mechanism 36B shown in FIG. 13, instead of the fixing mechanism 34 and the release mechanism 36.

The fixing mechanism 34B includes a plurality of support portions 56B and a cam mechanism 60. The fixing mechanism 34B may include one support portion 56B. The engaging member 56b of each of the support portions 56B is configured to be engaged with the ceiling portion 32c of the second chamber 32, similarly to the engaging member 56b of each of the support portions 56. In one embodiment, the engaging member 56b of each of the support portions 56B is formed such that the ceiling portion 32c is suspended therefrom, similarly to the engaging member 56b of each of the support portions 56. The cam mechanism 60 is configured to move the support portions 56B upward to bring the ceiling portion 32c into contact with the ceiling portion 26 of the first chamber 10.

As shown in FIG. 13, each of the support portions 56B has a rod shape. The ceiling portion 26 of the first chamber 10 has a plurality of holes 26h extending downward from the inside thereof. The holes 26h may be arranged at an equal interval around the axis AX. The holes 26h are connected to the recesses 39r in a state where the second chamber 32 is fixed to the first chamber 10. The support portions 56B are arranged in the holes 26h, respectively. Further, in a state where the ceiling portion 32c is suspended from the support portions 56B, the engaging members 56b of the support portions 56B are arranged in the recesses 39r and the extension portions 39e thereof, respectively.

The fixing mechanism 34B includes a plurality of shafts 61 and a cam 62. The ceiling portion 26 of the first chamber 10 further has a plurality of holes 26i. The holes 26i intersect the holes 26h and extend in the radial direction with respect to the axis AX. The shafts 61 are arranged in the holes 26i, respectively, to extend in the radial direction. One end of the shaft 61 protrudes outward from the ceiling portion 26 and form a cam follower 61f. The other end of the shaft 61 has an inclined surface 61s. Each of the support portions 56B has an opening through which a corresponding shaft 61 among the plurality of shafts 61 penetrates. The inclined surface 61s of each of the shafts 61 is in contact with a portion of the corresponding support portion 56B among the plurality of support portions 56B where an upper portion of the opening is formed.

The cam 62 has a ring shape and extends around the axis AX. The cam 62 is disposed to surround one ends of the shafts 61 (i.e., the cam follower 61f). The cam 62 has a cam surface 62s. The cam follower 61f of each of the shafts 61 is in contact with the cam surface 62s.

When the cam 62 is rotated around the axis AX, the shafts 61 are moved along the radial direction. When the cam 62 is rotated around the axis AX to make the shafts 61 close to the axis AX, the support portions 56B are moved upward. Accordingly, the second chamber 32 is fixed in a state where the ceiling portion 32c is in contact with the ceiling portion 26 of the first chamber 10. On the other hand, when the cam 62 is rotated around the axis AX to make the shafts 61 away from the axis AX, the support portions 56B are moved downward. Accordingly, the second chamber 32 is separated downward from the first chamber 10 to release the fixing of the second chamber 32 to the first chamber 10.

The release mechanism 36B generates a power for rotating the cam 62 around the axis AX. The release mechanism 36B includes, e.g., a motor. When the release mechanism 36B rotates the cam 62 around the axis AX to make the shafts 61 away from the axis AX, the second chamber 32 is separated downward from the first chamber 10. Accordingly, the fixing of the second chamber 32 to the first chamber 10 is released.

Figure 14:
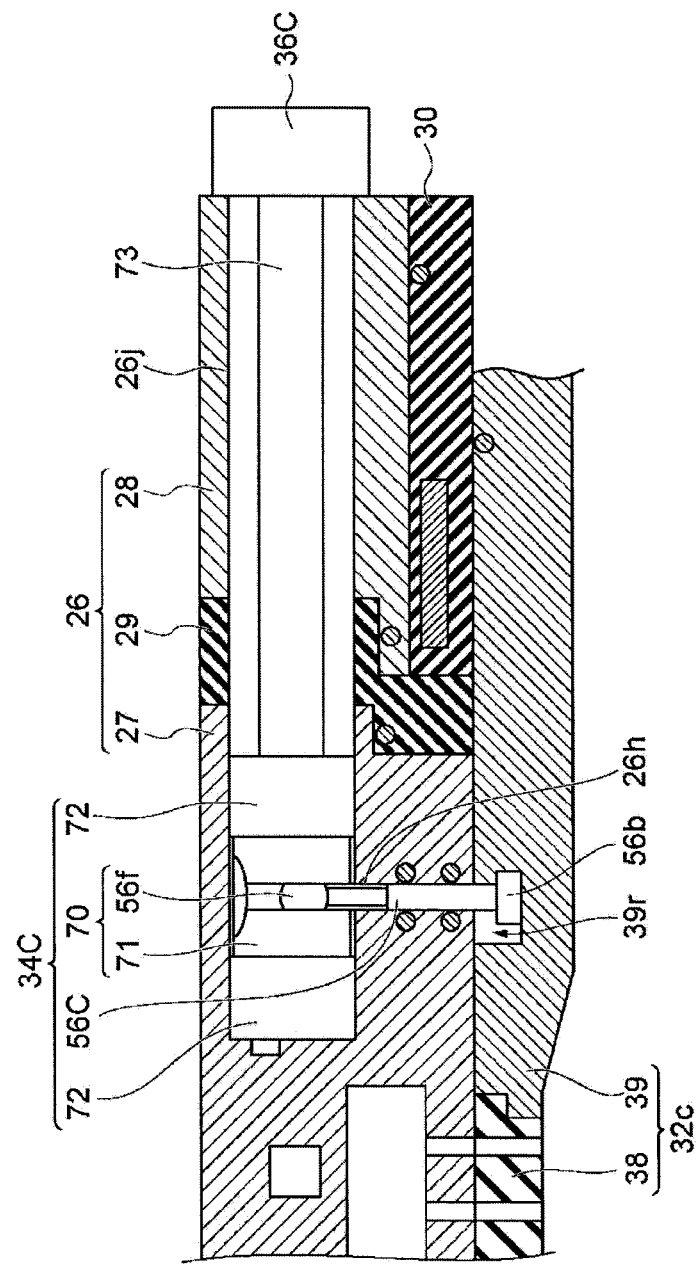
FIG. 14 shows a fixing mechanism and a release mechanism according to still another exemplary embodiment.

Hereinafter, FIG. 14 will be referred to. FIG. 14 shows a fixing mechanism and a release mechanism according to still another exemplary embodiment. The substrate processing apparatus 1 may include the fixing mechanism 34C and the release mechanism 36C shown in FIG. 14, instead of the fixing mechanism 34 and the release mechanism 36.

The fixing mechanism 34C includes a plurality of supports 56C and a cam mechanism 70. The fixing mechanism 34C may include one support portion 56C. The engaging member 56b of each of the support portions 56C is formed such that the ceiling portion 32c is suspended therefrom, similarly to the engaging members 56b of each of the support portions 56. The cam mechanism 70 is configured to move the support portions 56C upward to bring the ceiling portion 32c in contact with the ceiling portion 26 of the first chamber 10.

As shown in FIG. 14, each of the support portions 56C has a rod shape. The ceiling portion 26 of the first chamber 10 has a plurality of holes 26h extending downward from the inside thereof. The holes 26h may be arranged at an equal interval around the axis AX. The holes 26h are connected to the recesses 39r in a state where the second chamber 32 is fixed to the first chamber 10. The support portions 56C are arranged in the holes 26h, respectively. Further, in a state where the ceiling portion 32c is suspended from the support portions 56C, the engaging members 56b of the support portions 56C are arranged in the recesses 39r and the extension portions 39e thereof, respectively.

The ceiling portion 26 of the first chamber 10 further has a plurality of holes 26j. The holes 26j intersect with the holes 26h and extend in the radial direction with respect to the axis AX. The upper ends of the support portions 56C are arranged in the holes 26j, respectively. The upper ends of the support portions 56C form a plurality of followers 56f.

The cam mechanism 70 includes the plurality of cam followers 56f and a plurality of cams hafts 71. The cam shafts 71 are arranged in the holes 26j, respectively. Each of the cam shafts 71 has a substantially cylindrical shape and extends in the radial direction with respect to the axis AX. Both ends of each of the cam shafts 71 are supported by a pair of cam shaft bearings 72. Each of the cam shafts 71 is supported by the pair of cam shaft bearings 72 to be rotatable about the central axis thereof.

Each of the cam shafts 71 has a cam surface on an inner side thereof. Each of the cam followers 56f is in contact with the cam surface of the corresponding cam shaft 71 among the plurality of cam shafts 71.

When the cam shafts 71 are rotated about the central axes thereof, the cam followers 56f (i.e., the upper ends of the support portions 56C) are moved upward or downward. Accordingly, the support portions 56C are also moved upward or downward. When the cam shafts 71 are rotated to move the support portions 56C upward, the second chamber 32 is fixed in a state where the ceiling portion 32c is in contact with the ceiling portion 26 of the first chamber 10. On the other hand, when the cam shafts 71 are rotated to move the support portions 56C downward, the second chamber 32 is separated downward from the first chamber 10 and the fixing of the second chamber 32 to the first chamber 10 is released.

The release mechanism 36C generates a power for rotating the cam shafts 71 via the shaft 73. The release mechanism 36C includes, e.g., a motor. When the cam shafts 71 are rotated such that the release mechanism 36C moves the support portions 56C downward, the second chamber 32 is separated downward from the first chamber 10 and the fixing of the first chamber to the first chamber 10 is released.

While various embodiments have been described above, various omissions, substitutions, and changes may be made without being limited to the above-described embodiments. Further, other embodiments can be implemented by combining elements in different embodiments.

For example, in another embodiment, the substrate processing apparatus may be another type of plasma processing apparatus such as an inductively coupled plasma processing apparatus, an electron cyclotron resonance (ECR) plasma processing apparatus, or a plasma processing apparatus for generating plasma using microwaves. Further, in still another embodiment, the substrate processing apparatus may be a substrate processing apparatus configured to perform substrate processing other than plasma processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. An apparatus for substrate processing comprising:
   a first chamber having an inner space and an opening;
   a substrate support disposed in the inner space of the first chamber;
   an actuator configured to move the substrate support between a first position and a second position along a first direction;

a second chamber that is disposed in the inner space of the first chamber, wherein the second chamber includes
a ceiling portion,
a baffle, and
one or more ring members, wherein
the baffle is disposed to surround the substrate support when the substrate support is located at the first position, and
said one or more ring members are arranged to surround a substrate placed on the substrate support when the substrate support is located at the first position, and, together with the substrate support when the substrate support is located at the first position, defines an enclosed substrate processing space, the second chamber being transferred between the inner space of the first chamber and an outside of the first chamber through the opening when the substrate support is located at the second position; and
at least one fixing mechanism configured to detachably fix the second chamber to the first chamber in the inner space of the first chamber, wherein
said at least one fixing mechanism is configured to detachably fix the ceiling portion of the second chamber to a ceiling portion of the first chamber in the inner space of the first chamber, and
the second chamber is moved as a unit including the ceiling portion of the second chamber, the baffle, and the one or more ring members through the opening along a second direction, different from the first direction.

2. The apparatus of claim 1, wherein said at least one fixing mechanism includes:
an engaging member configured to be engaged with the ceiling portion of the second chamber, and
a biasing member configured to bias the engaging member upward in a state where the engaging member is engaged with the ceiling portion of the second chamber.

3. The apparatus of claim 2, further comprising:
a release mechanism configured to release the second chamber from the first chamber by moving said at least one fixing mechanism along the first direction.

4. The apparatus of claim 3, wherein the release mechanism includes an air supply device.

5. The apparatus of claim 1, wherein said at least one fixing mechanism includes:
an engaging member configured to be engaged with the ceiling portion of the second chamber, and
a cam mechanism configured to move the engaging member engaged with the ceiling portion of the second chamber upward to bring the ceiling portion of the second chamber in contact with the ceiling portion of the first chamber.

6. The apparatus of claim 1, wherein
the first chamber has a substrate transfer port,
the second chamber has a movable shutter that faces the substrate transfer port when the second chamber is fixed to the first chamber in the inner space of the first chamber, and
the substrate processing apparatus further comprises:
an additional actuator configured to drive the movable shutter between an open position and a closed position.

7. An apparatus for substrate processing comprising:
a first chamber having a first inner space and a first opening;
a substrate support disposed in the first inner space;
a second chamber disposed in the first inner space and having a second inner space and a second opening;
at least one actuator configured to relatively move at least one of the substrate support and the second chamber in the first inner space between a first state in which the second opening is closed by the substrate support and a second state in which the substrate support is separated from the second opening along a first direction, wherein the second chamber includes
a ceiling portion,
a baffle, and
one or more ring members, wherein
the baffle is disposed to surround the substrate support when the substrate support is located at the first state, and
said one or more ring members are arranged to surround a substrate placed on the substrate support when the substrate support is located at the first state, and, together with the substrate support when the at least one actuator is in the first state, defines an enclosed substrate processing space; and
at least one fixing mechanism configured to detachably fix the second chamber to the first chamber in the first inner space, wherein the second chamber is transferred between the first inner space and an outside of the first chamber through the first opening when the fixing of the second chamber to the first chamber by said at least one fixing mechanism is released, wherein
said at least one fixing mechanism is configured to detachably fix the ceiling portion of the second chamber to a ceiling portion of the first chamber in the inner space of the first chamber, and
the second chamber is moved as a unit including the ceiling portion of the second chamber, the baffle, and the one or more ring members through the first opening along a second direction, different from the first direction.

8. The apparatus of claim 7, wherein the second chamber is transferred between the first inner space and the outside of the first chamber through the first opening when the fixing of the second chamber to the first chamber by said at least one fixing mechanism is released in the second state.

9. The apparatus of claim 7, wherein said at least one actuator includes a first actuator configured to move the substrate support between a first upper position and a first lower position in the first inner space, and
the substrate support is located at the first upper position in the first state and located at the first lower position in the second state.

10. The apparatus of claim 9, wherein said at least one actuator includes a release mechanism configured to move the second chamber between a second upper position and a second lower position in the first inner space, and
the second chamber is located at the second upper position in the first state and located at the second lower position in the second state.

11. The apparatus of claim 7, wherein
the at least one fixing mechanism includes a support portion that extends from the first chamber toward the second chamber and an engaging member that extends along the second direction further than the support portion,
the second chamber includes a recess including an opening facing the first chamber and having an extension portion under the opening that extends further in the second direction than the opening, and the second chamber is engaged and disengaged with the first chamber by moving the second chamber along the first direction and along the second direction relative to the first chamber.

12. The apparatus of claim 11, wherein said at least one fixing mechanism includes a biasing member configured to bias the engaging member upward in a state where the engaging member is engaged with the second chamber.

13. The apparatus of claim 11, wherein said at least one fixing mechanism includes a cam mechanism configured to move the engaging member engaged with the second chamber upward to bring the ceiling portion of the second chamber in contact with the ceiling portion of the first chamber.

14. The apparatus of claim 7, wherein the opening is in a sidewall of the first chamber.

15. The apparatus of claim 6, wherein the movable shutter is releasably coupled to the additional actuator.

16. The apparatus of claim 1, further comprising:

a release mechanism configured to release the second chamber from the first chamber by moving said at least one fixing mechanism along the first direction.

17. The apparatus of claim 1, wherein the at least one fixing mechanism includes a support portion that extends from the first chamber toward the second chamber and an engaging member that extends along the second direction further than the support portion, the second chamber includes a recess including an opening facing the first chamber and having an extension portion under the opening that extends further in the second direction than the opening, and the second chamber is engaged and disengaged with the first chamber by moving the second chamber along the first direction and along the second direction relative to the first chamber.

18. The apparatus of claim 1, wherein the opening is in a sidewall of the first chamber.

* * * * *